(12) United States Patent
Chang et al.

(10) Patent No.: US 12,068,252 B2
(45) Date of Patent: Aug. 20, 2024

(54) HYBRID CONDUCTIVE STRUCTURES

(71) Applicant: Taiwan Semiconductor Manufacturing Co., Ltd., Hsinchu (TW)

(72) Inventors: Cheng-Wei Chang, Taipei (TW); Chien-Shun Liao, Taipei (TW); Sung-Li Wang, Zhubei (TW); Shuen-Shin Liang, Hsinchu (TW); Shu-Lan Chang, Hsinchu (TW); Yi-Ying Liu, Hsinchu (TW); Chia-Hung Chu, Taipei (TW); Hsu-Kai Chang, Hsinchu (TW)

(73) Assignee: Taiwan Semiconductor Manufacturing Company, Ltd.

( * ) Notice: Subject to any disclaimer, the term of this patent is extended or adjusted under 35 U.S.C. 154(b) by 98 days.

(21) Appl. No.: 17/875,675

(22) Filed: Jul. 28, 2022

(65) Prior Publication Data
US 2023/0016515 A1   Jan. 19, 2023

Related U.S. Application Data

(62) Division of application No. 16/950,537, filed on Nov. 17, 2020, now Pat. No. 11,581,259.

(Continued)

(51) Int. Cl.
*H01L 23/532* (2006.01)
*H01L 21/768* (2006.01)
*H01L 23/528* (2006.01)

(52) U.S. Cl.
CPC .. *H01L 23/53266* (2013.01); *H01L 21/76816* (2013.01); *H01L 21/7684* (2013.01);
(Continued)

(58) Field of Classification Search
CPC ....... H01L 21/76897; H01L 21/823431; H01L 21/7684; H01L 21/76816; H01L 21/76883;
(Continued)

(56) References Cited

U.S. PATENT DOCUMENTS

| 10,553,481 B2 | 2/2020 | Chang et al. |
| 10,867,851 B2 | 12/2020 | Lee et al. |

(Continued)

FOREIGN PATENT DOCUMENTS

| CN | 109427734 A | 3/2019 |
| CN | 110197848 A | 9/2019 |

(Continued)

*Primary Examiner* — Jaehwan Oh
*Assistant Examiner* — John M Parker
(74) *Attorney, Agent, or Firm* — Sterne, Kessler, Goldstein & Fox P.L.L.C.

(57) ABSTRACT

The present disclosure describes a method for the fabrication of ruthenium conductive structures over cobalt conductive structures. In some embodiments, the method includes forming a first opening in a dielectric layer to expose a first cobalt contact and filling the first opening with ruthenium metal to form a ruthenium contact on the first cobalt contact. The method also includes forming a second opening in the dielectric layer to expose a second cobalt contact and a gate structure and filling the second opening with tungsten to form a tungsten contact on the second cobalt contact and the gate structure. Further, the method includes forming a copper conductive structure on the ruthenium contact and the tungsten contact, where the copper from the copper conductive structure is in contact with the ruthenium metal from the ruthenium contact.

20 Claims, 17 Drawing Sheets

Related U.S. Application Data

(60) Provisional application No. 63/044,200, filed on Jun. 25, 2020.

(52) U.S. Cl.
CPC .... *H01L 21/76883* (2013.01); *H01L 23/5283* (2013.01); *H01L 23/53238* (2013.01)

(58) Field of Classification Search
CPC .......... H01L 23/5226; H01L 23/53266; H01L 29/0847; H01L 29/665
See application file for complete search history.

(56) References Cited

U.S. PATENT DOCUMENTS

| | | |
|---|---|---|
| 11,024,550 B2 | 6/2021 | Liao et al. |
| 11,282,749 B2 | 3/2022 | Kao et al. |
| 2012/0043592 A1 | 2/2012 | Zhao et al. |
| 2012/0241868 A1 | 9/2012 | Tsai et al. |
| 2015/0187896 A1 | 7/2015 | Kamineni et al. |
| 2018/0130703 A1* | 5/2018 | Sardesai .......... H01L 21/76889 |
| 2020/0075729 A1 | 3/2020 | Yen et al. |
| 2020/0105586 A1 | 4/2020 | Hsu et al. |
| 2020/0168723 A1 | 5/2020 | Hsu et al. |
| 2020/0176574 A1 | 6/2020 | Huang et al. |
| 2020/0395237 A1 | 12/2020 | Lin et al. |
| 2021/0057580 A1 | 2/2021 | Chiu et al. |
| 2021/0091200 A1 | 3/2021 | Liu et al. |
| 2021/0118801 A1* | 4/2021 | Wang ................ H01L 23/53228 |
| 2021/0305051 A1 | 9/2021 | Qiao et al. |
| 2021/0313441 A1 | 10/2021 | Lin et al. |
| 2021/0407925 A1 | 12/2021 | Chang et al. |
| 2022/0123126 A1 | 4/2022 | Lin et al. |

FOREIGN PATENT DOCUMENTS

| | | |
|---|---|---|
| TW | 202013503 A | 4/2020 |
| TW | 202021002 A | 6/2020 |

* cited by examiner

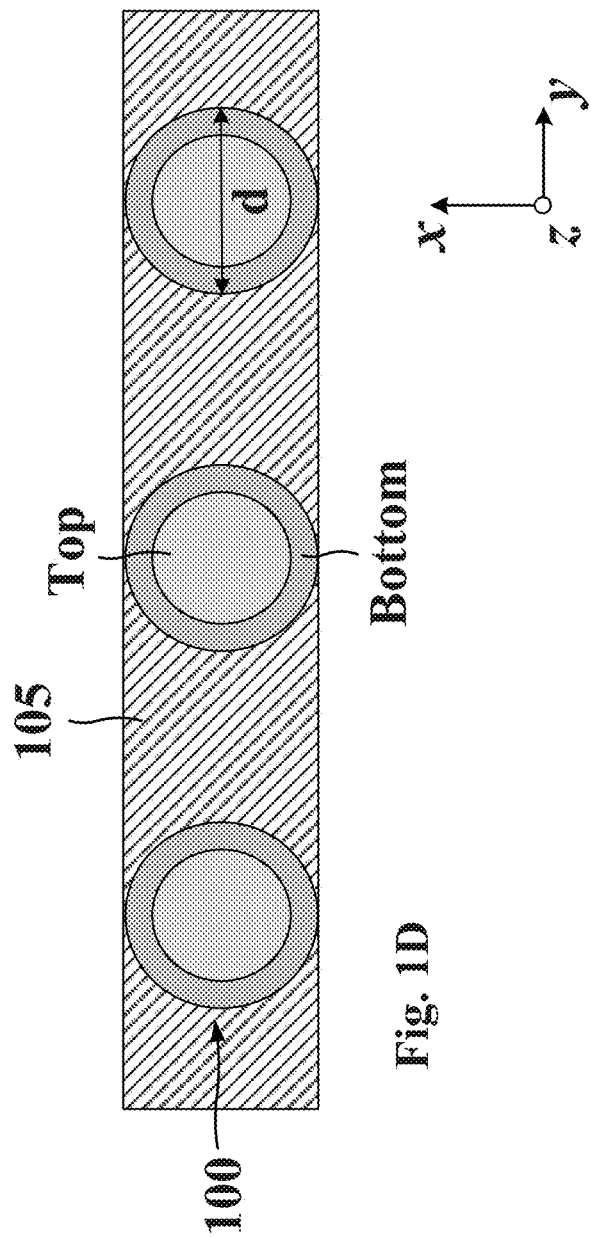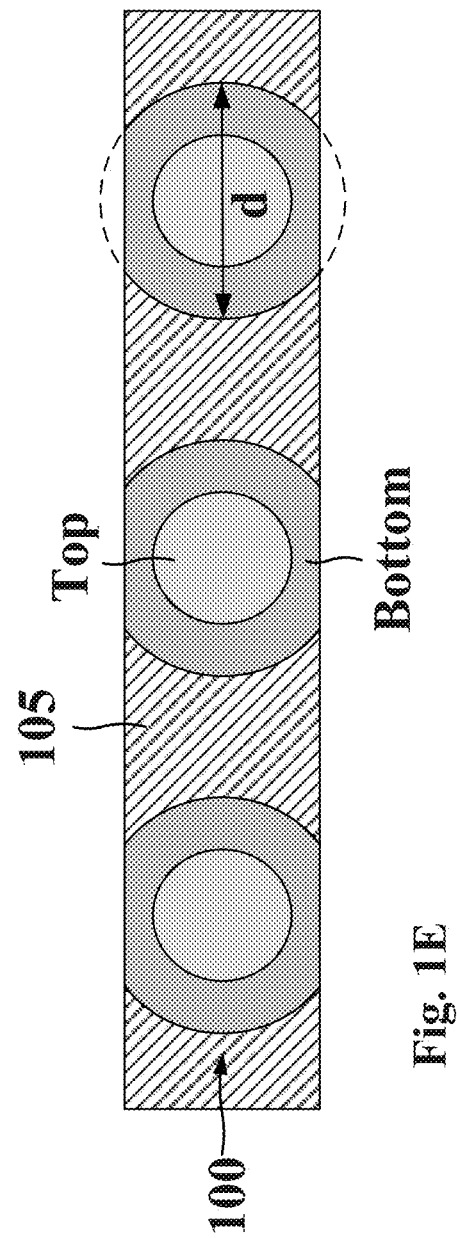

HYBRID CONDUCTIVE STRUCTURES

CROSS-REFERENCE TO RELATED APPLICATIONS

This application is a divisional of U.S. patent application Ser. No. 16/950,537, titled "Hybrid Conductive Structures," filed on Nov. 17, 2020, which claims the benefit of U.S. Provisional Patent Application No. 63/044,200, titled "Lossless Via Contacts with Selective Deposition in a Compact Structure," filed on Jun. 25, 2020, each of which is incorporated herein by reference in its entirety.

BACKGROUND

In integrated circuits, conductive structures (e.g., metal contacts, vias, and lines) are electrically coupled to transistor regions, such as a gate electrode and source/drain terminals, to propagate electrical signals from and to the transistors. The conductive structures, depending on the complexity of the integrated circuit, can form multiple layers of metal wiring.

BRIEF DESCRIPTION OF THE DRAWINGS

Aspects of the present disclosure are best understood from the following detailed description when read with the accompanying figures.

FIGS. 1D and 1E are top views of ruthenium conductive structures on cobalt conductive structures, in accordance with some embodiments.

DETAILED DESCRIPTION

Figure 1A:
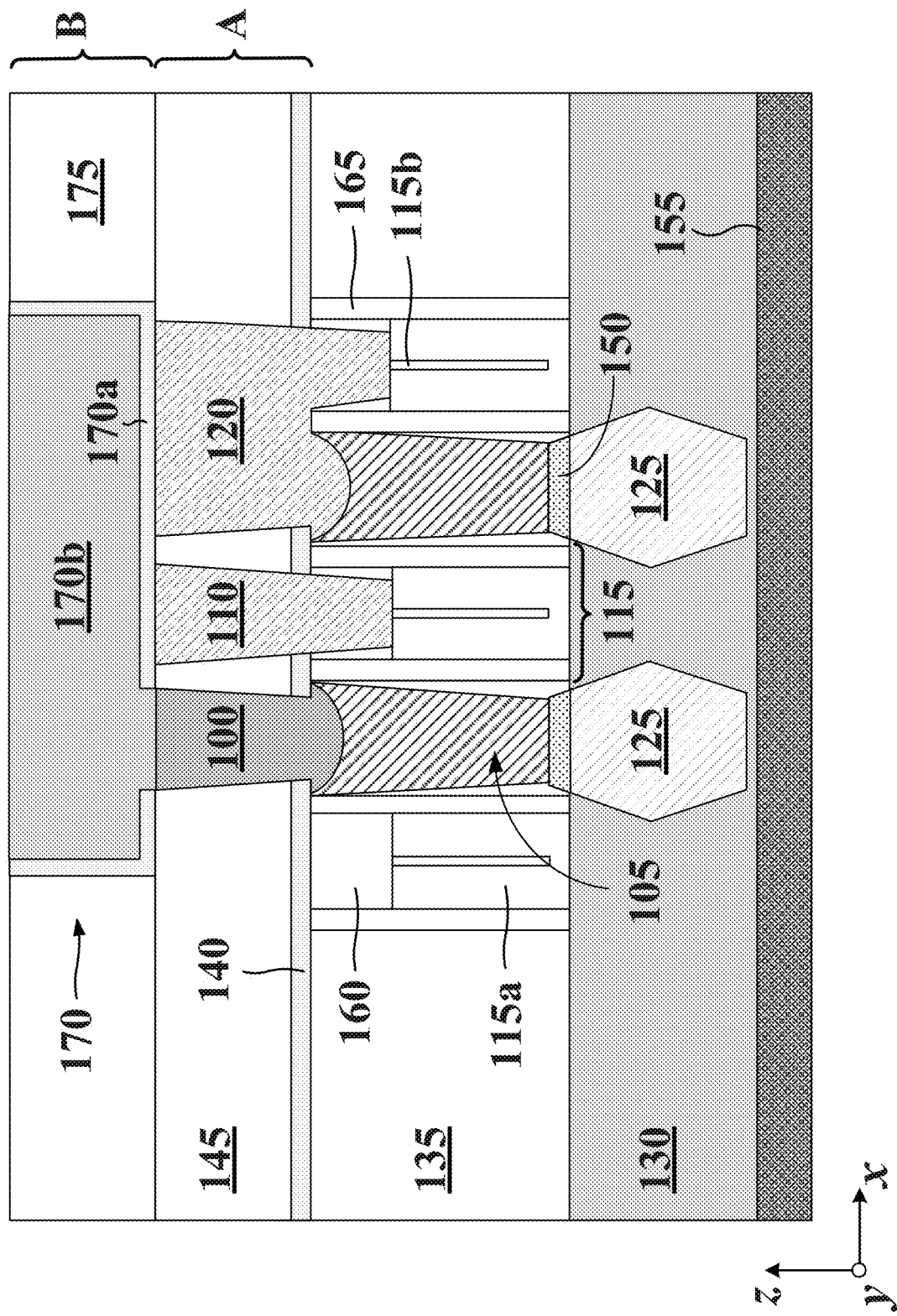
FIGS. 1A-C are cross-sectional views of metallization layers with ruthenium and tungsten conductive structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

Active and passive devices in an integrated circuit (IC) are connected at a local level (e.g., within the same area of the IC) and at a global level (e.g., between different areas of the IC) through a number of conductive structures, such as metal contacts, metal vias, and metal lines. These conductive structures—which can include different conductive materials (e.g., a different metal fill)—are formed in vertically stacked metallization (or interconnect) layers.

Design considerations are taken into account when metallization layers with different conductive materials are stacked on top of each other to avoid performance degradation due to unwanted interaction between the conductive materials. For example, high aspect ratio tungsten (W) conductive structures in middle-of-line (MOL) formed on cobalt (Co) conductive structures can suffer from corrosion, material segregation, resistive phase transition, and/or material loss, which can lead to an increase in electrical resistance and/or electrical fails, and yield loss. The aforementioned failure mechanisms are exacerbated by the aspect ratio of the conductive structures (e.g., the ratio of the structure's height to the structure's width), which can range between about 3:1 and about 4:1. Meanwhile, lower aspect ratio W conductive structures (e.g., with an aspect ratio lower than about 3:1) formed on Co conductive structures do not appear to suffer from the shortcomings of the higher aspect ratio counterparts.

The embodiments described herein are directed to methods for the replacement of high aspect ratio W conductive structures on Co conductive structures with high aspect ratio ruthenium (Ru) conductive structures. In some embodiments, the W on Co "system" for high aspect ratio conductive structures (e.g., with an aspect ratio greater than about 3:1) is replaced by a Ru on Co system. According to some embodiments, advantages of Ru metal over W metal include, but are not limited to, improved wire resistivity (e.g., about $3.81 \times 10^{-16}$ $\mu\Omega \cdot m^2$), higher melting point (e.g., about 2334° C.) and thermal stability, and absence of a resistive phase transition (e.g., Ru has a low resistance single hexagonal closed packed (HCP) crystal structure). In some embodiments, low aspect ratio W conductive structures on Co conductive structures or high aspect ratio W conductive structures on cobalt-free structures, such as the transistor gate structures, are not replaced because these W conductive structures do not suffer from the shortcomings of the high aspect ratio W conductive structures discussed above. Therefore, metallization layers with a combination of W conductive structures and Ru conductive structures are within the scope and the spirit of the disclosure. In some embodiments, the high aspect ratio Ru conductive structures are formed prior to the formation of the W conductive structures. In some embodiments, the high aspect ratio Ru conductive structures are formed after the formation of the W conductive structures. In some embodiments, the Ru metal is grown by a selective deposition on the underlying Co conductive structure. In some embodiments, the Ru conductive structures described herein are liner-free or barrier-free conductive structures. For example, the Ru conductive structures do not include liner or barrier layers and the Ru metal is directly deposited on bottom and sidewall surfaces of the conduct openings over the Co conductive structures.

Figure 1B:
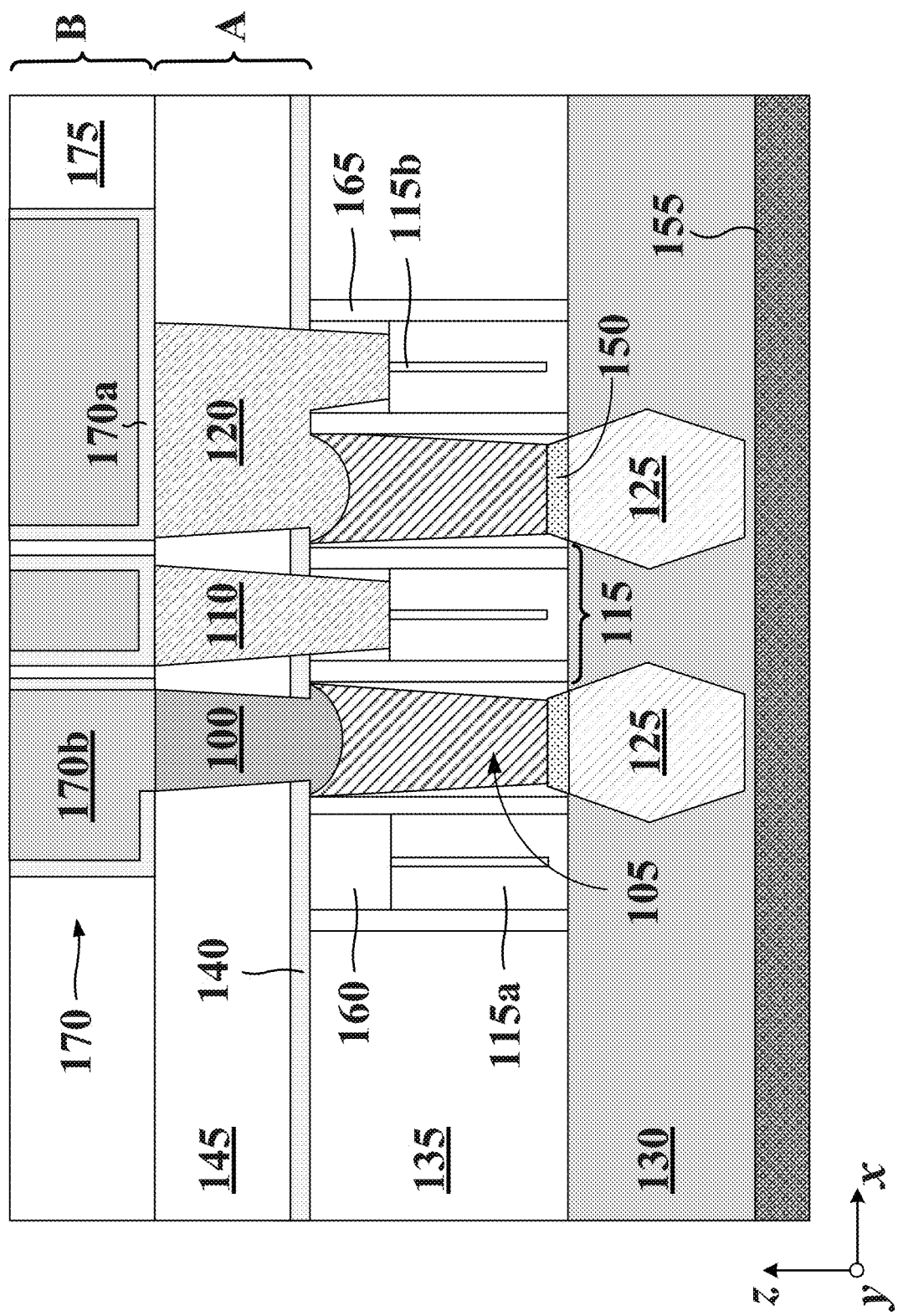
Figure 1C:
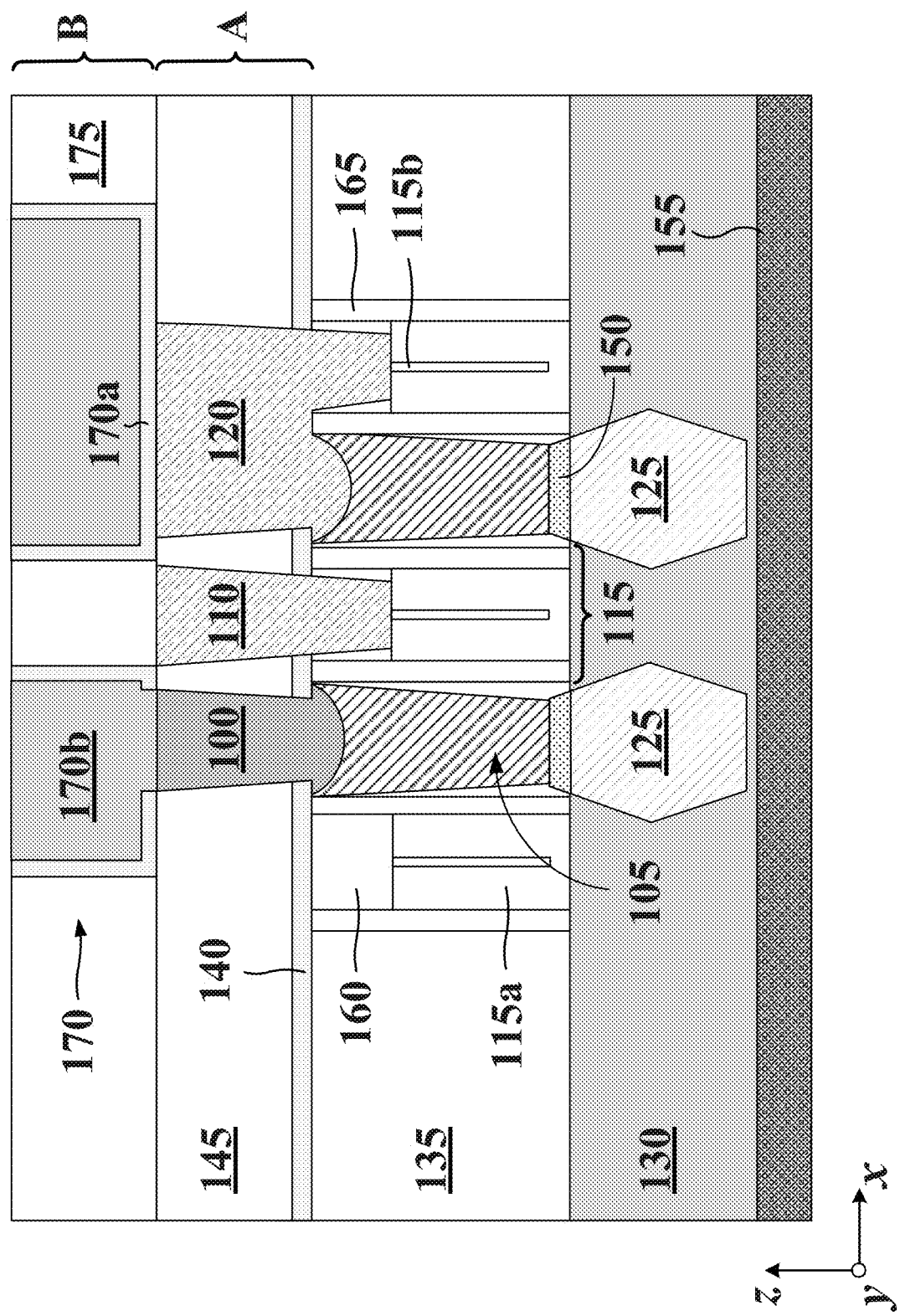

FIGS. 1A, 1B, and 1C are partial cross-sectional views of a metallization or interconnect layer A (also referred to herein as a "metallization layer") with respective upper metallization layer B formed thereon, according to some embodiments. In some embodiments, FIGS. 1A, 1B, and 1C share metallization layer A but include different layouts of metallization layer B. Metallization layer A will be described in reference to FIG. 1A below. By way of example and not limitation, metallization layer A includes a Ru conductive structure 100 formed on a Co conductive structure 105 (e.g., directly on Co conductive structure 105), a W gate conductive structure 110 formed on a gate structure 115 (e.g., directly on gate conductive structure 115), and a W conductive structure 120 partially formed on a gate structure 115 and a neighboring Co conductive structure 105 (e.g., directly on gate structure 115 and Co conductive structure 105). As shown in FIG. 1A, Co conductive structures 105 are formed on source/drain (S/D) epitaxial structures 125, which are in turn formed in a top portion of an active region 130. According to some embodiments, Co conductive structures 105 are trench-shaped structures having a length in the y-direction larger than a width in the x-direction as shown in the top views of FIGS. 1D and 1E. In some embodiments, the length of Co conductive structures 105 in the y-direction is between about 50 nm and about 55 nm, and the width of Co conductive structures 105 in the x-direction is between about 28 nm and about 36 nm. In some embodiments, the height of Co conductive structures 105 in the z-direction is between about 28 nm and about 36 nm. By way of example and not limitation, conductive structures, such as Ru conductive structure 100, W gate conductive structure 110, and W conductive structure 120 are circular or oval-shaped contacts.

According to some embodiments, one or more Ru conductive structures 100 can be formed along the length of a Co conductive structure 105 (e.g., along the y-direction) as shown in the examples of FIGS. 1D and 1E. In some embodiments, FIGS. 1D and 1E are projections of bottom portions and top portions of Ru conductive structures 100 on the upper surface of a Co conductive structure 105. As discussed above, the bottom portion of each Ru conductive structure 100 forms an anchor point with an arcuate or hemispherical shape within Co conductive structure 105. Depending on the dimensions of Co conductive structure 105, diameter d of the anchor point may be contained within the width of Co conductive structure as shown in FIG. 1D or may be cut off by the width of Co conductive structure 105 as shown by the dashed line in FIG. 1E. In some embodiments, diameter d of the anchor point may not be limited by the length of Co conductive structure 105 in the y-direction as shown in FIGS. 1D and 1E. In some embodiments, diameter d of the anchor point can range from about 21 nm to about 39 nm (e.g., about 30 nm).

The layout of metallization layer A shown in FIGS. 1A, 1B, and 1C is exemplary and not limiting. For example, the number and arrangement of the aforementioned conductive structures (e.g., Ru conductive structure 100, W gate conductive structure 110, and W conductive structure 120) can be different from the one shown in FIGS. 1A, 1B, and 1C. Therefore, layout variations of metallization layer A are within the spirit and the scope of this disclosure. In some embodiments, metallization layer A is an MOL interconnect layer that electrically connects Co conductive structures 105 and gate structures 115 to upper metallization layers, like upper metallization layer B shown in FIGS. 1A, 1B, and 1C.

In FIG. 1A, Co conductive structures 100, W gate conductive structure 110, and W conductive structure 120 are partially surrounded by first dielectric 135, etch stop layer (ESL) 140, and second dielectric 145. By way of example and not limitation, each of first and second dielectrics 135 and 145 can be an interlayer dielectric (ILD) in which the aforementioned conductive structures are formed.

In some embodiments, first and second dielectrics 135 and 145 include one or more silicon oxide based dielectrics deposited by, for example, a high-density chemical vapor deposition (HDCVD) process, a plasma-enhanced chemical vapor deposition process (PECVD), a plasma-enhanced atomic layer deposition process (PEALD), or any other suitable deposition process. By way of example and not limitation, first and second dielectrics 135 and 145 can be deposited at a thickness between about 15 nm and about 200 nm. The aforementioned deposition thickness ranges, deposition methods, and materials are exemplary and not limiting. Different materials, thickness ranges, or deposition methods can be used to form first and second dielectrics 135 and 145. These materials, thickness ranges, and deposition methods are within the spirit and the scope of this disclosure.

In some embodiments, ESL 140 facilitates the formation of the openings for Ru conductive structure 100, W gate conductive structure 110, and W conductive structure 120 in first and second dielectrics 135 and 145. The material selection for ESL 140 can be made from silicon nitride (SiNx), silicon oxide (SiOx), silicon oxynitride (SiON), silicon carbide (SiC), silicon carbo-nitride (SiCN), boron nitride (BN), silicon boron nitride (SiBN), silicon-carbon-boron-nitride (SiCBN), metal oxides, or combinations thereof. By way of example and not limitation, ESL 140 can be deposited with low-pressure chemical vapor deposition (LPCVD), plasma-enhanced chemical vapor deposition (PECVD), chemical vapor deposition (CVD), or any other suitable deposition process. In some embodiments, ESL 140 has a thickness between about 3 nm and about 30 nm (e.g., between 9.5 nm and about 11 nm).

As shown in FIG. 1A, a silicide layer 150 is interposed between each S/D epitaxial structure 125 and Co conductive structure 105 to provide a low resistance path. By way of example and not limitation, silicide layer 150 can include nickel platinum silicide (NiPtSi), nickel silicide (NiSi), titanium silicide (TiSi), cobalt silicide (CoSi), tungsten silicide (Wsi), or any suitable silicide at a thickness between about 4 nm and about 10 nm.

In some embodiments, active region 130 includes a semiconductor material like silicon (Si) or germanium (Ge). In some embodiments, active region 130 includes a compound semiconductor), an alloy semiconductor, or combinations thereof. Examples of compound semiconductors include silicon carbide, gallium arsenide (GaAs), gallium phosphide (GaP), indium phosphide (InP), indium arsenide (InAs), and indium antimonide (InSb). Examples of alloy semiconductors include SiGe, gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). In some embodiments, active region 130 is a fin structure associated with, for example, a fin field-effect transistor (finFET). In some embodiments, gate structures 115 are formed on active region 130 as shown in FIG. 1A. In some embodiments, gate structures 115 cover top and sidewall surface of active region 130. As shown in FIG. 1, active region 130 is formed on a semiconductor substrate 155, which can include, for example, Si. Alternatively, substrate 155 can include Ge; a compound semiconductor, such as silicon carbide, GaAs, GaP, InP, InAs, and InSb; an alloy semiconductor, such as SiGe, GaAsP, AlInAs, AlGaAs, GaInAs, GaInP, and GaInAsP; or combinations thereof. In some embodiments, active region 130 is grown on substrate 180 or formed from substrate 180 with appropriate photolithography and etching operations. In some embodiments, active region 130 includes one or more fin structures patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over substrate 155 and patterned using a photolithography process. Spacers are formed alongside the patterned sacrificial layer using a self-aligned process. The sacrificial layer is then removed, and the remaining spacers may then be used to pattern the fin structures.

In some embodiments, S/D epitaxial structures 125 are formed within etched portions of active region 130. By way of example and not limitation, S/D epitaxial structures 125 include two or more doped epitaxial semiconductor layers (not shown in FIG. 1) deposited by a CVD process. S/D epitaxial structures 125 appropriate for p-type transistors may include boron-doped (B-doped) SiGe, B-doped Ge, B-doped germanium-tin (GeSn), or combinations thereof. Accordingly, S/D epitaxial structures 125 appropriate for n-type transistors may include arsenic (As) or phosphorous (P)-doped Si, carbon-doped silicon (Si:C), or combinations thereof for n-type transistors.

As shown in FIGS. 1A, 1B, and 1C, lower portions of Co conductive structure 105 and gate structures 115 are surrounded by first dielectric 135, which is disposed over active region 130 according to some embodiments. In some embodiments, gate structures 115 are multilayer structures that include a dielectric stack (not shown), a stack 115a with work function metallic layers, and a metal fill 115b. A capping layer 160 is formed on each gate structure 115 to protect gate structures 115 from operations during the formation of Co conductive structures 105. Each gate structure 115 is electrically isolated from adjacent Co conductive structures 105 by gate spacers 165 and first dielectric 135. In some embodiments, W gate conductive structure 110 and W conductive structure 120 traverse through capping layer 160 to contact metal fill 115b. In some embodiments, metal fill 115b includes W deposited by a fluorine-free process.

In some embodiments, upper metallization layer B shown in FIGS. 1A, 1B, and 1C can be formed over Ru conductive structure 100, W gate conductive structure 110, and W conductive structure 120. By way of example and not limitation, upper metallization layers B can be a back-end-of-line (BEOL) metallization layer that includes copper (Cu) conductive structures, such as Cu conductive structure 170 surrounded by a low-k dielectric material 175—e.g., a dielectric material with a dielectric constant (k-value) lower than about 3.9. In some embodiments, the Cu conductive structure includes a barrier layer 170a and a Cu metal fill 170b. In some embodiments, barrier layer 170a can be a stack that further includes a tantalum nitride (TaN) layer, which functions as a Cu diffusion barrier, and a tantalum (Ta) metal layer, which functions as a low resistance layer on which a Cu seed layer (not shown) is grown. According to some embodiments, barrier layer 170a is a continuous layer that surrounds Cu metal fill 170b and prevents Cu atoms from diffusing into the underlying W conductive structures 110 and 120 and the surrounding dielectric materials. In some embodiments, barrier layer 170a is not formed on Ru conductive structure 100. For example, referring to FIG. 1A, the top surface of Ru conductive structure 100 disrupts the continuity of barrier layer 170a. The Ru metal in Ru conductive structure 100 can function as a diffusion barrier for Cu atoms, and therefore, an additional barrier layer (e.g., barrier layer 170a) is not required. Further, the absence of barrier layer 170a on Ru conductive structure 100 reduces the contact resistance between Cu conductive structure 170 and Ru conductive structure 100.

In some embodiments, Ru conductive structure 100, W gate conductive structure 110, and W conductive structure 120 are connected to Cu conductive structures 170 with different layouts as shown in FIGS. 1A, 1B, and 1C. Regardless of the layout of upper metallization layer B, Cu conductive structures 170 are formed on Ru conductive structures, like Ru conductive structure 100, without an intervening barrier layer 170a as shown in FIGS. 1A, 1B, and 1C.

Figure 2A:
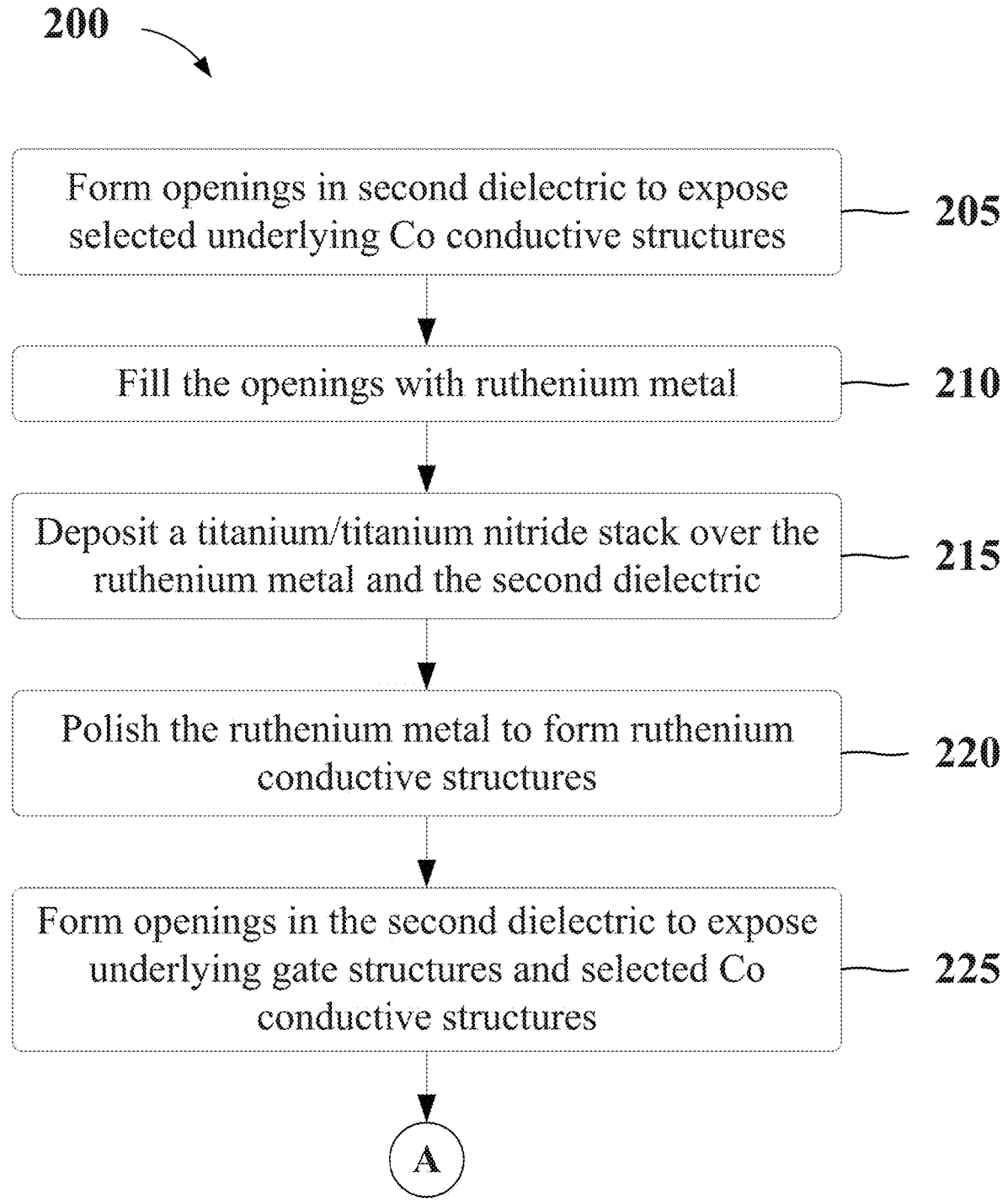
FIGS. 2A and 2B are flowcharts of a method for forming a metallization layer with ruthenium and tungsten conductive structures, in accordance with some embodiments.
Figure 2B:
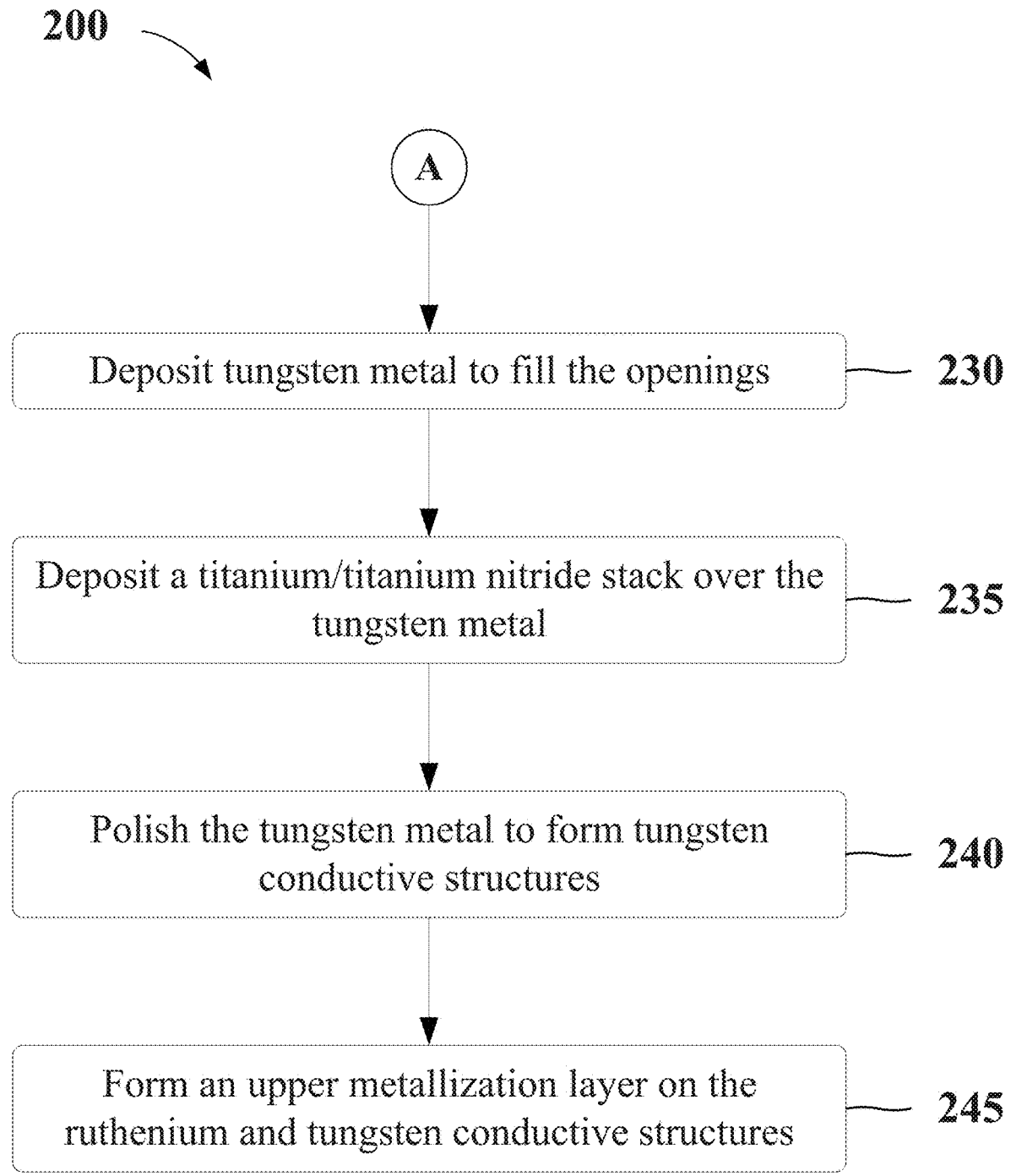

In some embodiments, FIGS. 2A and 2B are flowcharts of a method 200 for the formation of metallization layer A with the Ru and W conductive structures shown in FIGS. 1A, 1B, and 1C. Other fabrication operations may be performed between the various operations of method 200 and may be omitted merely for clarity and ease of description. These various operations are within the spirit and the scope of this disclosure. Additionally, not all operations may be required to perform the disclosure provided herein. Some of the operations may be performed simultaneously, or in a different order than those shown in FIGS. 2A and 2B. In some embodiments, one or more other operations may be performed in addition to or in place of the presently described operations. Method 200 will be described in reference to FIGS. 3-13.

Figure 3:
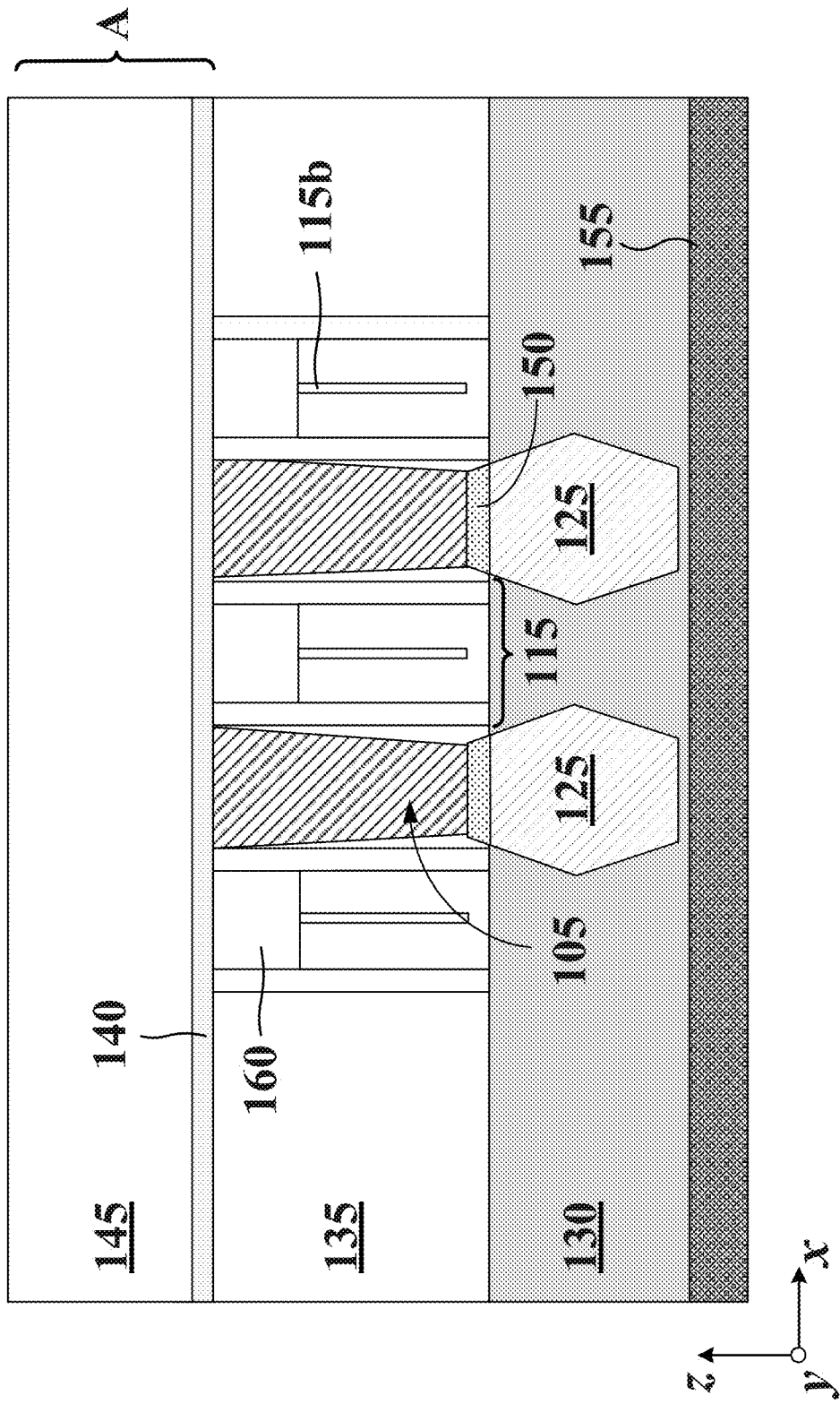
FIGS. 3-12 are cross-sectional views of intermediate structures during various fabrication operations for forming a metallization layer with ruthenium and tungsten conductive structures, in accordance with some embodiments.

According to some embodiments, FIG. 3 is a starting structure for method 200. At this fabrication stage, active region 130, gate structures 125, S/D epitaxial structures 125, first dielectric 135, first ESL 140, and second dielectric 145 have been previously formed on substrate 155 with operations not shown in method 200. In some embodiments, the structure of FIG. 3 is a partially fabricated wafer prior to the formation of the conductive structures in metallization layer A.

Figure 4:
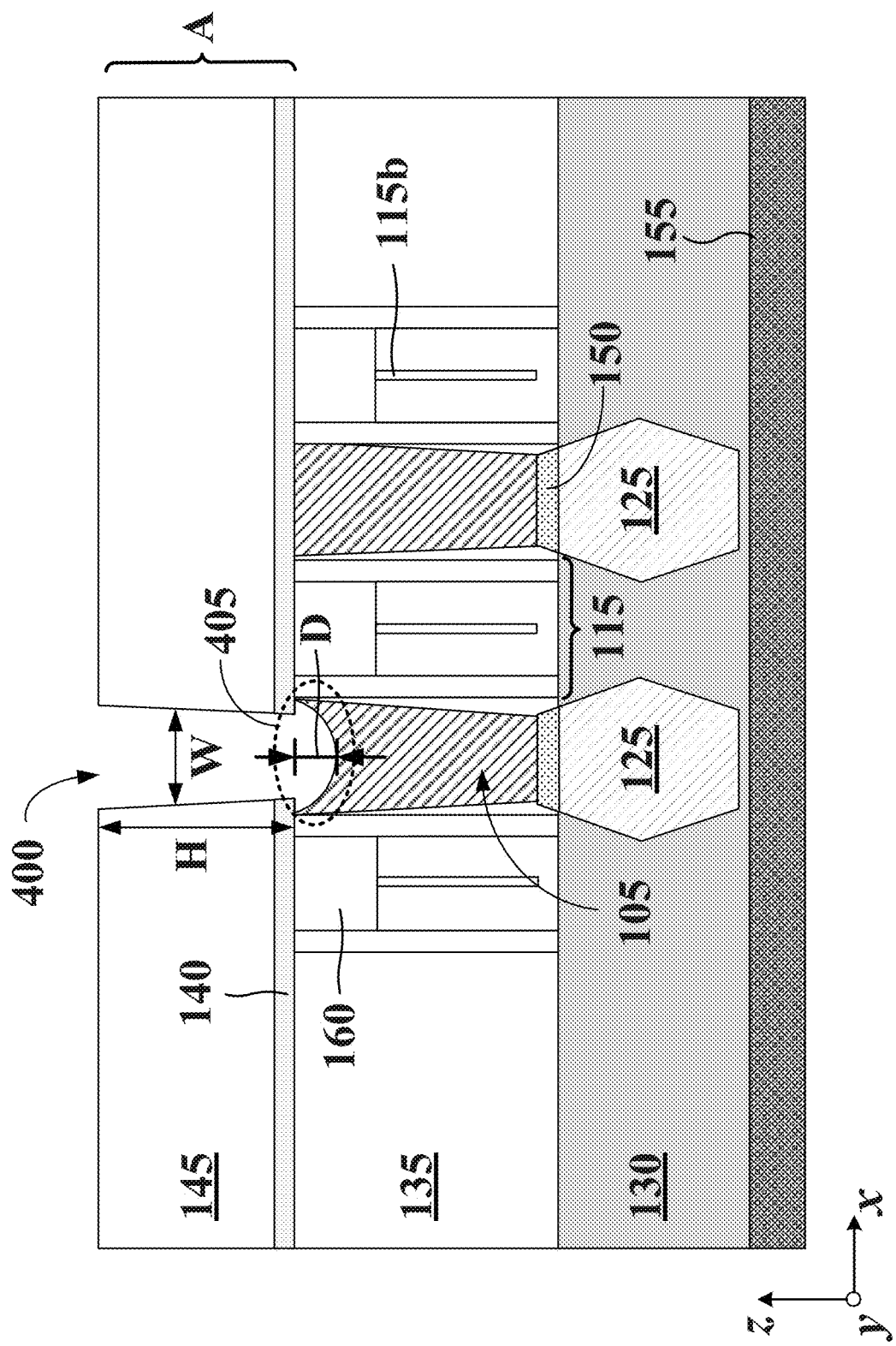

In referring to FIG. 2A, method 200 begins with operation 205 and the process of forming openings in second dielectric 145 to expose selected underlying Co conductive structures 105 disposed on S/D epitaxial structures 125. For example, not all the Co conductive structures will be exposed during operation 205 of method 200. By way of example and not limitation, FIG. 4 shows the structure of FIG. 3 after the formation of opening 400 in second dielectric 145 according to operation 205 of method 200. In some embodiments, multiple openings, like opening 400, are formed on selected Co conductive structures 105 according to a layout design. As shown in FIG. 4, opening 400 traverses through ESL 140 to expose top surfaces of Co conductive structure 105. In some embodiments, a top portion of Co conductive structure 105 is etched to form a hemispherical or arcuate-shaped anchor point 405. In some embodiments, the hemispherical or arcuate-shaped anchor point 405 has a depth D measured from a bottom surface of ESL 140 and ranges between about 7 nm and about 13 nm. According to some embodiments, the hemispherical or arcuate-shaped anchor point 405 is a feature that prevents Ru metal pull-out from opening 400 during a Ru polishing or planarization operation. As discussed above, the diameter of hemispherical or arcuate-shaped anchor point 405 is between about 21 nm and 39 nm (e.g., about 30 nm) and may be restricted by the width of Co conductive structure 105 if the width of Co conductive structure 105 along the x-axis is narrower than the diameter of hemispherical or arcuate-shaped anchor point 405.

In some embodiments, the aspect ratio of opening 400 ranges between about 3:1 and about 4:1. By way of example and not limitation, a width W of opening 400 along the x-direction can range from about 12.8 nm to about 14.1 nm and height H can range from about 43 nm to about 50 nm.

In some embodiments, opening 400 is formed by a combination of dry and wet etching operations. For example, the opening within second dielectric 145 can be formed by an anisotropic dry etching and the hemispherical or arcuate-shaped anchor point 405 can be formed by an isotropic wet etching. By way of example and not limitation, the wet etching can include an aqueous solution of butoxyethanol ($C_6H_{14}O_2$), hydroxylamine ($H_3NO$), and diethylenetriaminepentaacetic acid ($C_{14}H_{23}N_3O_{10}$), in which the main etchants are water and butoxyethanol while hydroxylamine and diethylenetriaminepentaacetic acid function as cobalt surface protectants. The wet etching chemistry, which is selective towards cobalt, isotropically etches the exposed cobalt metal in all directions (e.g., x-, y-, and z-directions). As a result, an arcuate or semi-spherical anchor point is formed on a top portion of cobalt conductive structure 105 as shown in FIG. 4. In some embodiments, the exposure of cobalt conductive structure 105 to the wet etching chemistry is timed to control the size of the semi-spherical or arcuate shaped anchor. For example, the exposure time can range from about 50 s to about 100 s or more depending on the etching rate at which cobalt metal is being consumed by the etching chemistry.

In referring to FIG. 2A, method 200 continues with operation 210 and the process of filling the openings (e.g., opening 400) with ruthenium metal. In some embodiments, the ruthenium metal is deposited directly on the Co conductive structures without the presence of intervening layers, such as barrier or liner layers. In some embodiments, the ruthenium metal in operation 210 is deposited by a thermal CVD process at a temperature between about 135° C. and about 250° C. using a ruthenium carbonyl precursor, such as triruthenium dodecacarbonyl ($Ru_3(CO)_{12}$), according to the following chemical reaction:

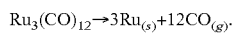

$$Ru_3(CO)_{12} \rightarrow 3Ru_{(s)} + 12CO_{(g)}.$$

Figure 5:
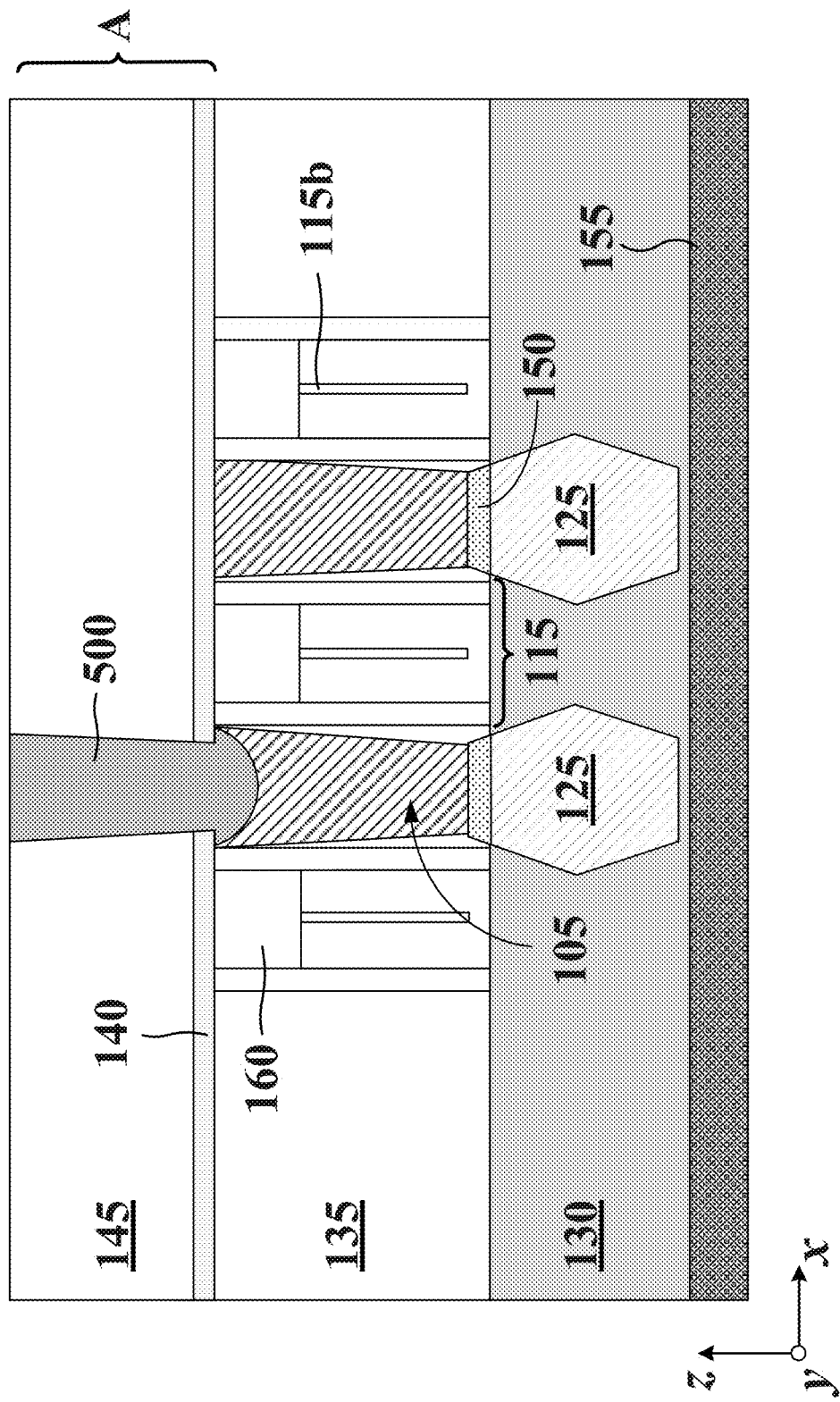

By way of example and not limitation, the ruthenium metal is deposited at a thickness of about 20 nm or at thickness sufficient to fill opening 400, including anchor point 405. In some embodiments, the growth of the ruthenium metal proceeds in a bottom-up manner. For example, ruthenium nucleation first occurs on exposed surfaces of cobalt conductive structure 105 and proceeds vertically along the z-direction until opening 400 is substantially filled. In some embodiments, a deposition temperature below about 250° C. promotes the bottom-up growth of the ruthenium metal and ensures that the ruthenium metal does not nucleate on second dielectric 145. By way of example and not limitation, FIG. 5 shows the structure of FIG. 4 after the deposition of ruthenium metal 500 according to operation 210 of method 200.

Figure 6:
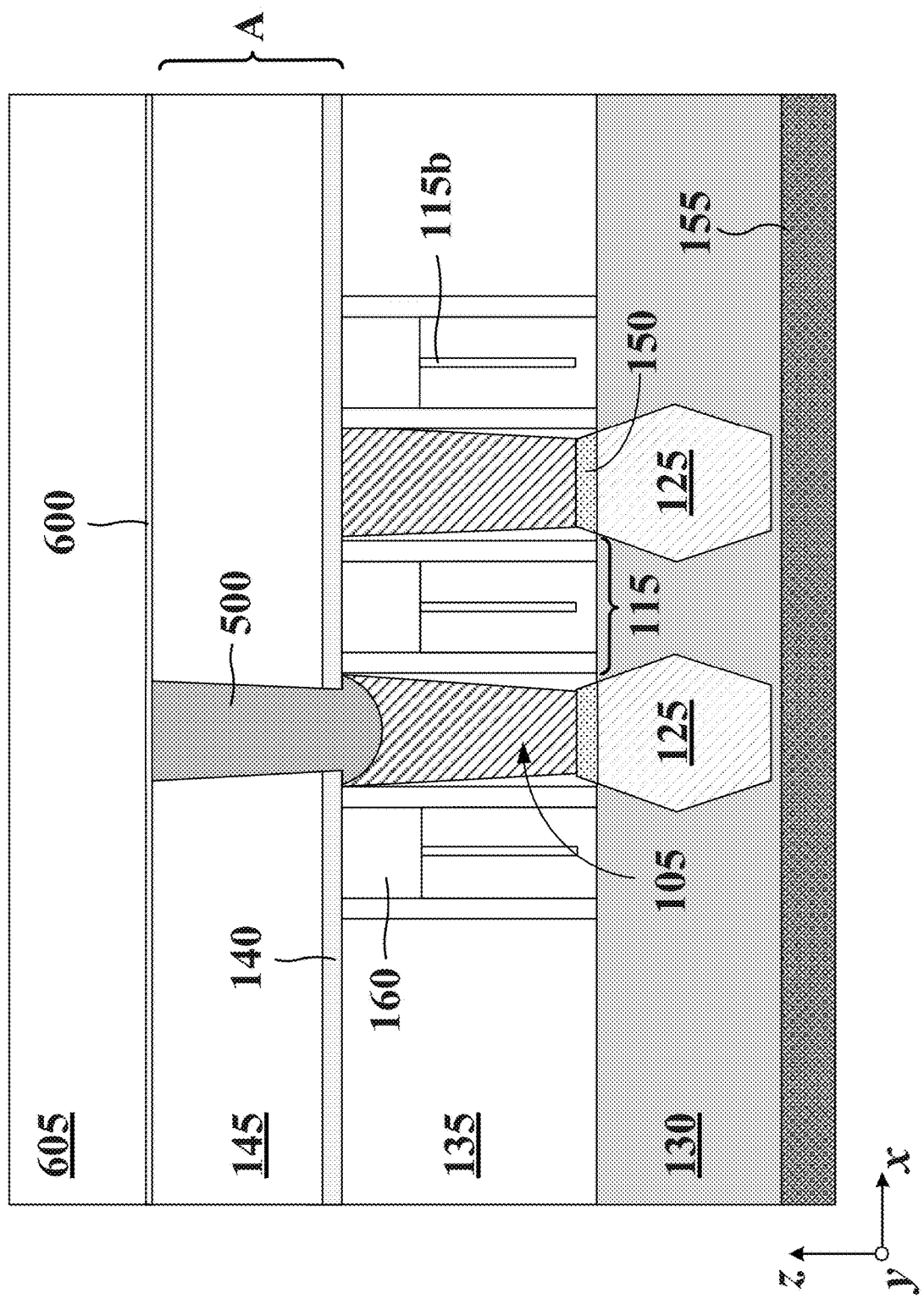

In referring to FIG. 2A, method 200 continues with operation 215 and the process of depositing a titanium (Ti)/titanium nitride (TiN) stack over ruthenium metal 500 and second dielectric 145. In some embodiments, the Ti/TiN stack functions as a capping layer for ruthenium metal 500 and as a sacrificial layer that facilitates a subsequent polishing process, such as a chemical mechanical polishing (CMP) process. According to some embodiments, FIG. 6 shows the structure of FIG. 5 after the formation of Ti layer 600 and TiN layer 605 according to operation 210 of method 200. According to some embodiments, Ti layer 600 is deposited with a physical vapor deposition (PVD) process at a thickness between about 6.9 nm and about 7.3 nm, and TiN layer 605 is deposited with a CVD process at a thickness between about 1.8 nm and about 2.2 nm. In some embodiments, Ti and TiN layer 600 and 605 are deposited in-situ to avoid the formation of a titanium oxide layer between Ti layer 600 and TiN layer 605.

Figure 7:
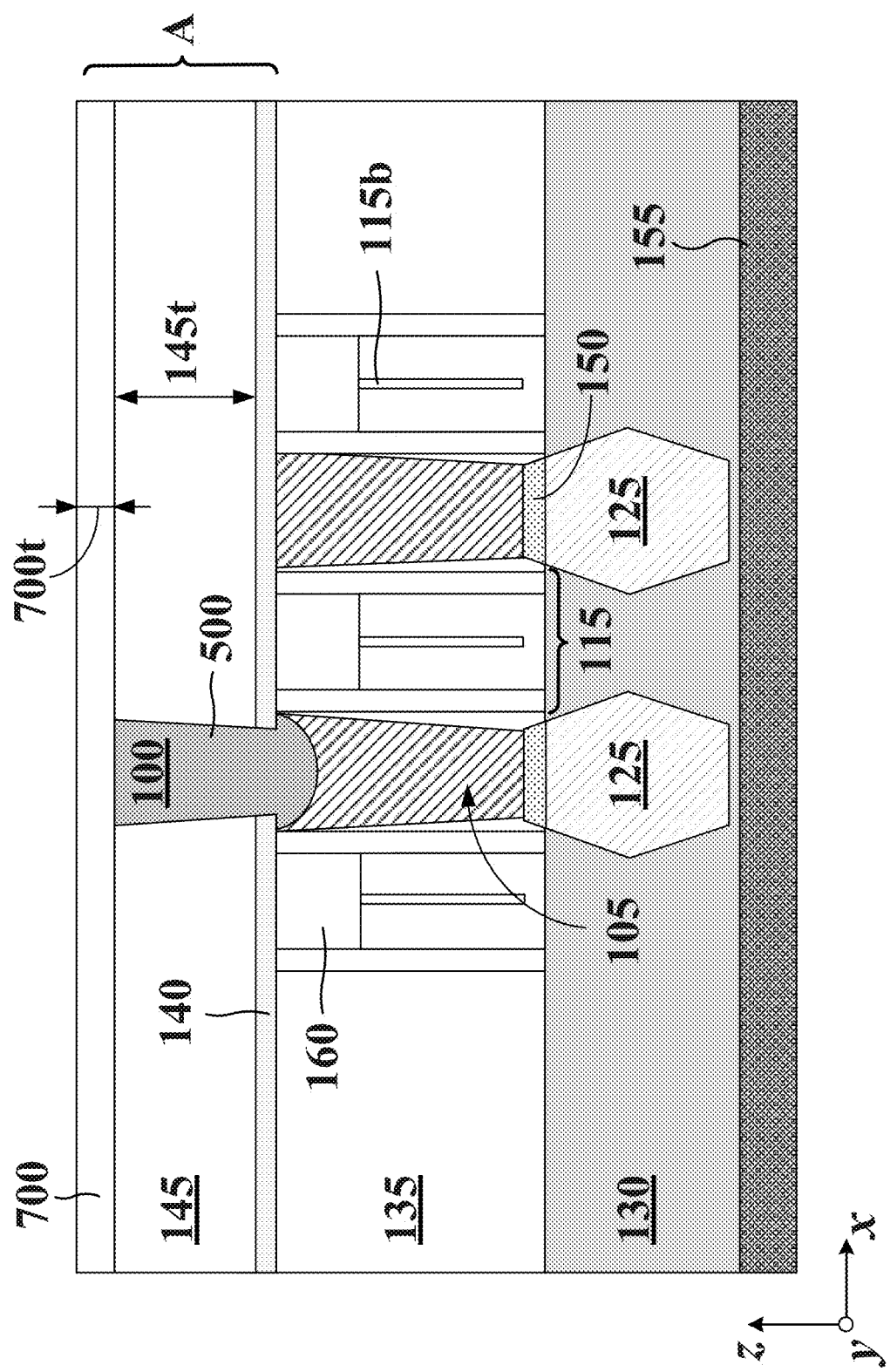

In referring to FIG. 2A, method 200 continues with operation 220 and the process of polishing ruthenium metal 500 to form Ru conductive structures, such as Ru conductive structure 100. In some embodiments, the polishing process in operation 220 includes a CMP process, which removes TiN layer 605, Ti layer 600, and top portions of Ru metal 500 and second dielectric 145 as shown in FIG. 7. In some embodiments, during the aforementioned CMP process, about 55% of second dielectric 145 is removed. For example, if second dielectric 145 was deposited at a thickness 145t of about 45 nm, about 25 nm of second dielectric 145 would be removed during the CMP process of operation 210. Consequently, thickness 145t of second dielectric 145 shown in FIG. 7 would be about 20 nm.

In some embodiments, to facilitate subsequent etching operations and to replenish the dielectric thickness consumed by operation 210, a third dielectric 700 is deposited on second dielectric layer 145. For example, third dielectric 700 can be deposited by a thickness 700t of about 18 nm or at an appropriate thickness to facilitate the subsequent etching operations. In some embodiments, second and third dielectrics 145 and 700 include similar dielectric materials, such as silicon oxide or carbon doped silicon oxide. In some embodiments, second and third dielectrics 145 and 700 are indistinguishable. For example, dielectrics 145 and 700 can be considered a single dielectric layer over ESL 140 with a thickness of about 38 nm.

Figure 8:
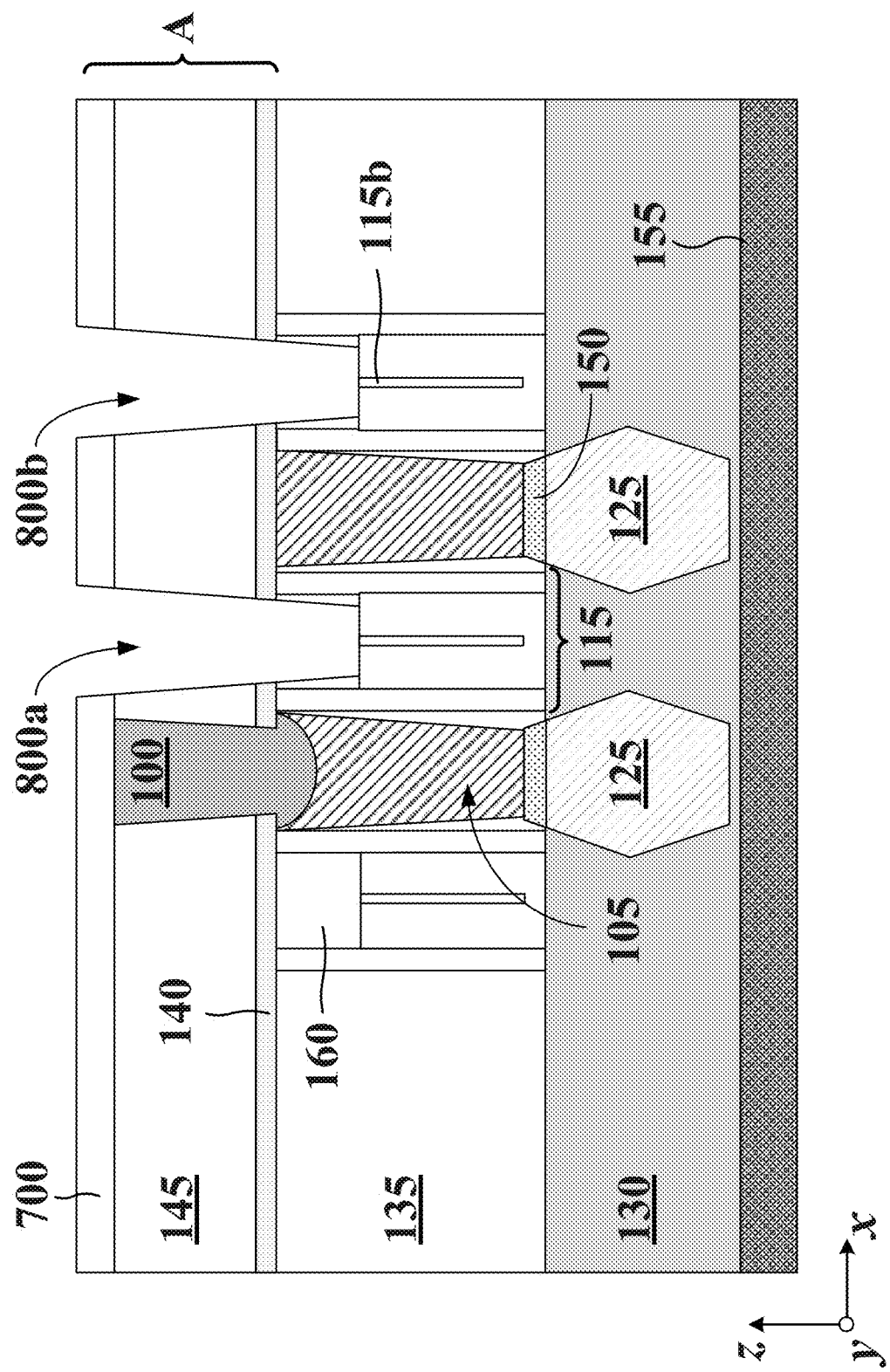
Figure 9:
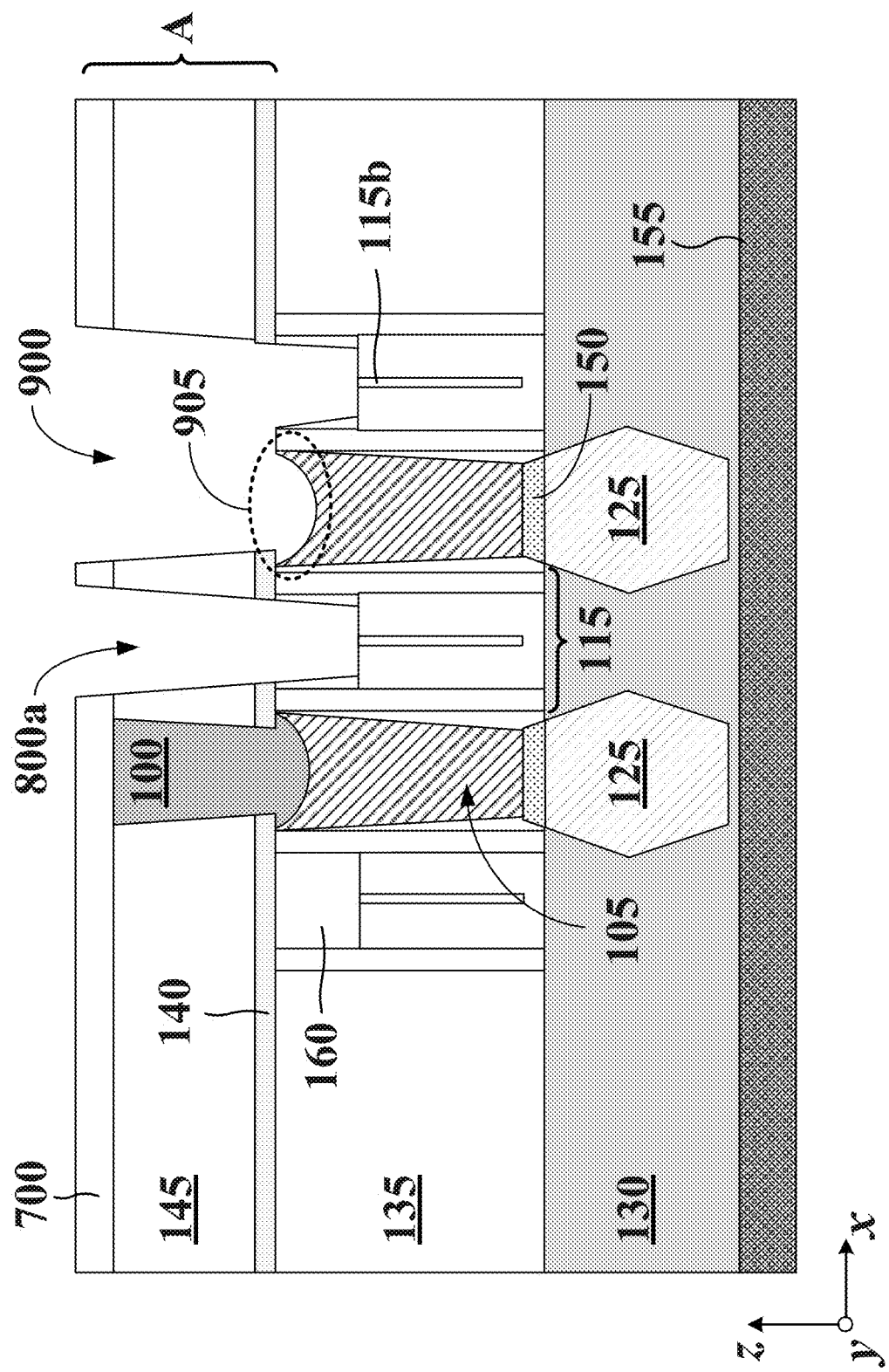

In referring to FIG. 2A, method 200 continues with operation 225 and the process of forming openings in second dielectric 145 to expose underlying gate structures 125 and selected Co conductive structures 105. By way of example and not limitation, operation 225 can include more than one photolithography and etching operations. For example, and in referring to FIG. 8, during a first photolithography and etching operation, openings 800a and 800b are formed in second dielectric 145 to expose gate structures 115. More specifically, openings 800a and 800b are formed by successively etching third dielectric 700, second dielectric 145, ESL 140, and capping layer 160 through a patterned photoresist layer (not shown) to expose metal fill 115b of gate structure 115. In referring to FIG. 9, during a second photolithography and etching operation, opening 800b shown in FIG. 8 is enlarged into opening 900, which in addition to exposing a gate structure 115, exposes a neighboring Co conductive structure 105. In some embodiments, opening 800a corresponds to the opening for W conductive structure 110 and opening 900 corresponds to the opening for W conductive structure 120 shown in FIGS. 1A-C.

In some embodiments, a wet etching process, similar to the wet etching process described in operation 205, etches a top portion of Co conductive structure 105 to form an anchor point 905 similar to anchor point 405 shown in FIG. 4. In some embodiments, the aforementioned wet etching process is selective towards cobalt and does not substantially etch the surrounding materials such as third dielectric 700, second dielectric 145, ESL 140, capping layer 160, and metal fill 115b. In some embodiments, anchor point 905 and anchor point 405 have substantially similar dimensions.

Figure 10:
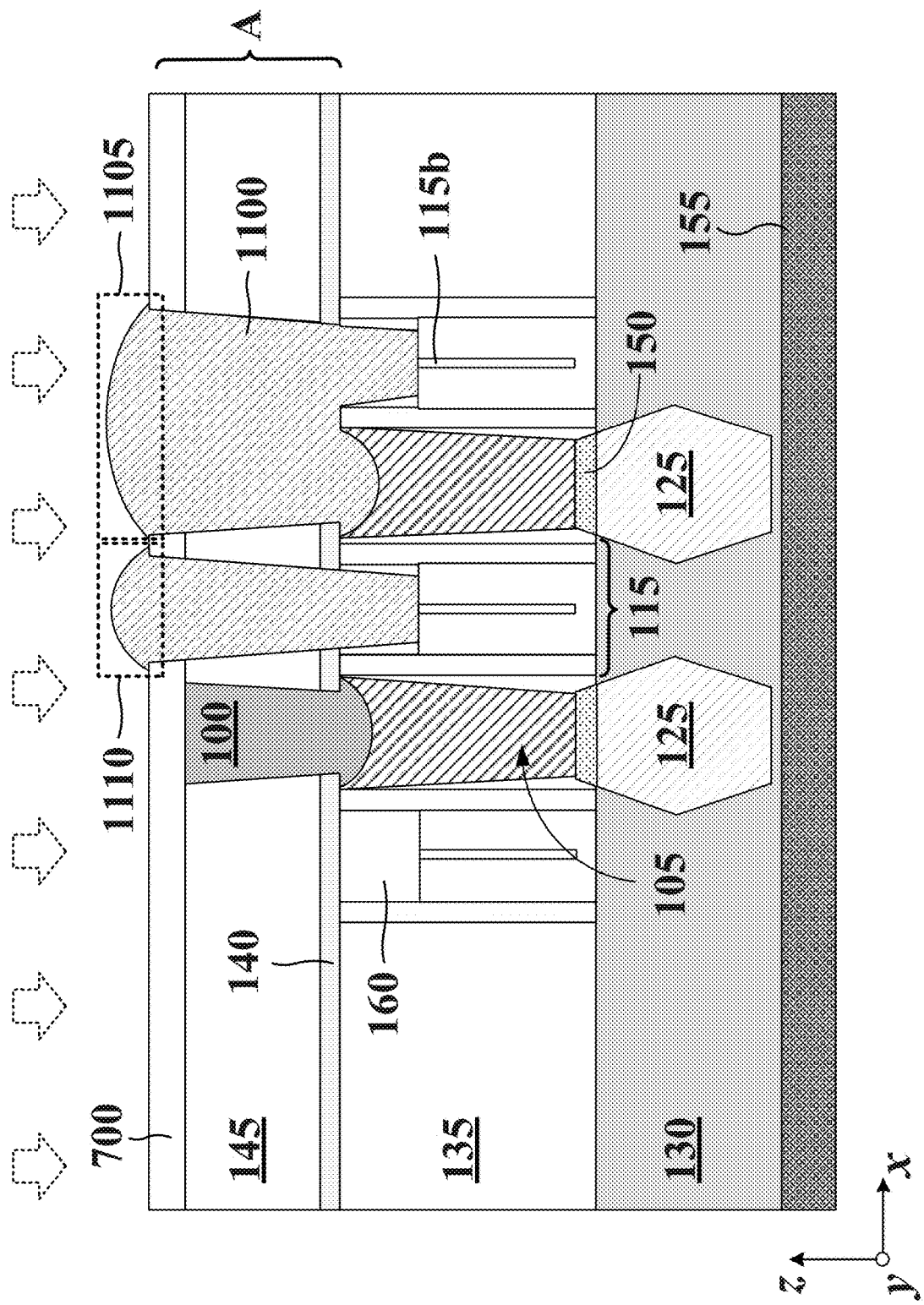

In referring to FIG. 2B, method 200 continues with operation 230 and the process of depositing W metal to fill openings 800a and 900 shown in FIG. 10. By way of example and not limitation, W metal can be deposited by a CVD process using tungsten hexafluoride ($WF_6$) and hydrogen at a temperature between about 345° C. and about 355° C. and at process pressure between about 10 Torr and about 25 Torr. According to some embodiments, and in referring to FIG. 10, W metal 1100 is deposited directly on metal fill 115b and on an exposed Co conductive structure 105. In some embodiments, W metal 1100 deposited under the above temperature and pressure conditions nucleates selectively on the exposed Co surfaces of Co conductive structure 105 and not on the dielectric surfaces of opening 900 such as third dielectric 700, second dielectric 145, and ESL 140. Consequently, W metal 1100 is "forced" to a bottom-up growth (e.g., along the z-direction), which results in the formation of dome-shaped top surfaces 1105 and 1110 shown in FIG. 10. In some embodiments, depending on the minimum spacing between openings 800a and 900, the dome-shaped top surfaces 1105 and 1110 shown in FIG. 10 may merge during the W metal growth process. In some embodiments, the dome-shaped top surfaces 1105 and 1110 shown in FIG. 10 will be removed in a subsequent polishing operation.

In some embodiments, and following the deposition of the W metal, germanium (Ge) dopants are implanted in second dielectric 145 at a depth between about 2 nm and about 3 nm. According to some embodiments, the Ge implants form a barrier that blocks CMP slurry from a subsequent W CMP process from reaching and corroding the underlying Co conductive structures 105. In some embodiments, the implant process includes a dopant dose between about $1\times10^{15}$ atoms/cm$^2$ and about $1.8\times10^{15}$ atoms/cm$^2$ and a dopant energy between about 32 KeV and about 43 KeV. In some embodiments, dopant doses below about $1\times10^{15}$ atoms/cm$^2$ and/or dopant depths below about 2 nm do not provide adequate protection against slurry attack while dopant doses above about $1.8\times10^{15}$ atoms/cm$^2$ and/or dopant depths above about 3 nm can cause adhesion issues to the W metal fill. By way of example and not limitation, FIG. 10 shows the structure of FIG. 9 during the implant process of operation 230 where dopants species represented by dashed arrows are accelerated towards substrate 155.

Figure 11:
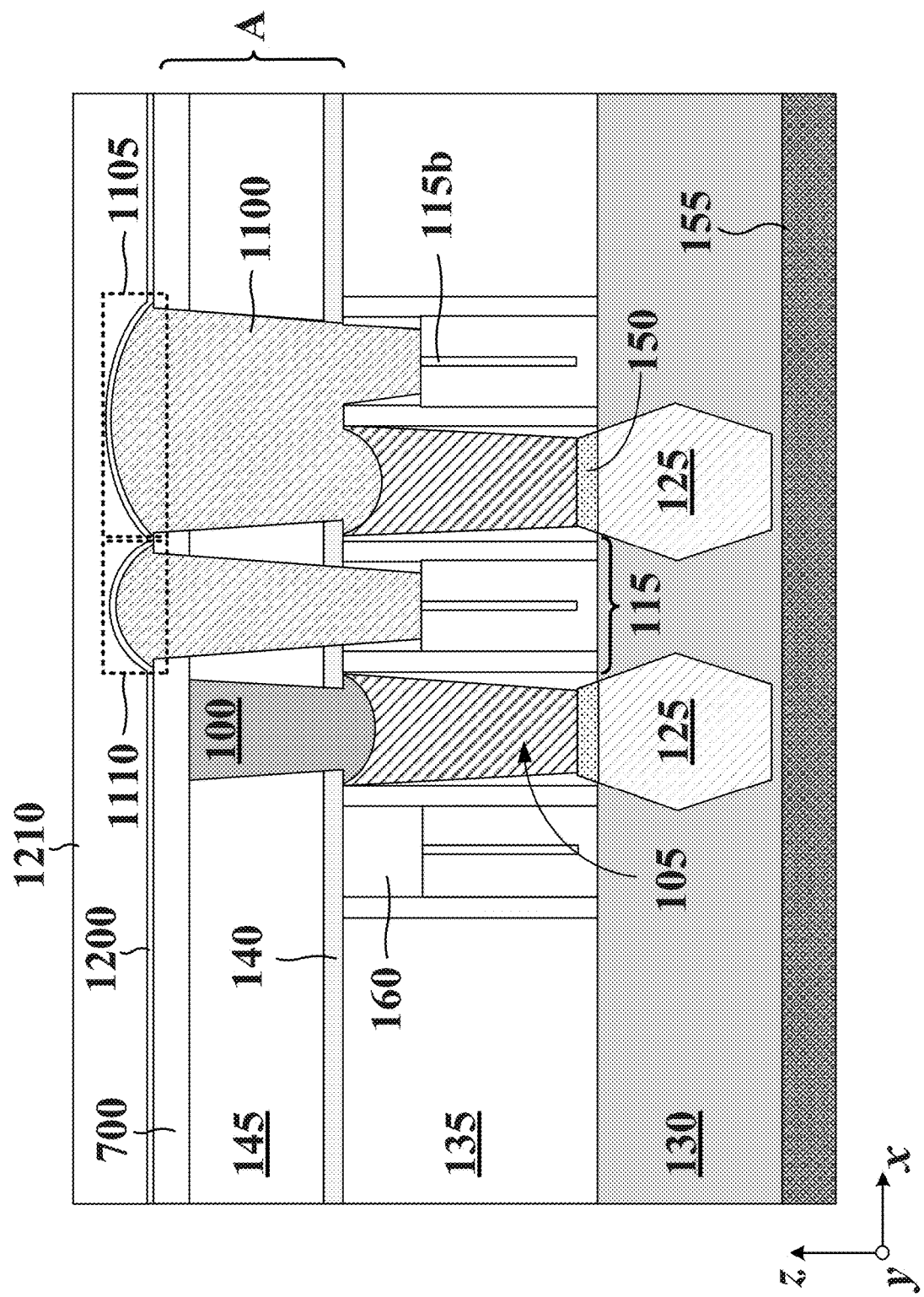

In referring to FIG. 2B, method 200 continues with operation 135 and the process of depositing a Ti/TiN stack over W metal 1100. In some embodiments, operation 235 is similar to operation 215 discussed above. According to some embodiments, FIG. 11 shows the structure of FIG. 10 after the deposition of Ti and TiN layers 1200 and 1205. In some embodiments, the Ti/TiN stack functions as a capping layer that prevents W metal 1100 from peeling. In some embodiments, the Ti/TiN stack functions as a sacrificial layer that facilitates a subsequent polishing process described in operation 240. In some embodiments, Ti layer 1200 is deposited with a PVD process at a thickness between about 6.9 nm and about 7.3 nm, and TiN layer 1210 is deposited with a CVD process at a thickness between about 1.8 nm and about 2.2 nm. In some embodiments, Ti and TiN layer 600 and 605 are deposited in-situ to avoid the formation of an intermediate titanium oxide layer between Ti layer 1200 and TiN layer 1210.

Figure 12:
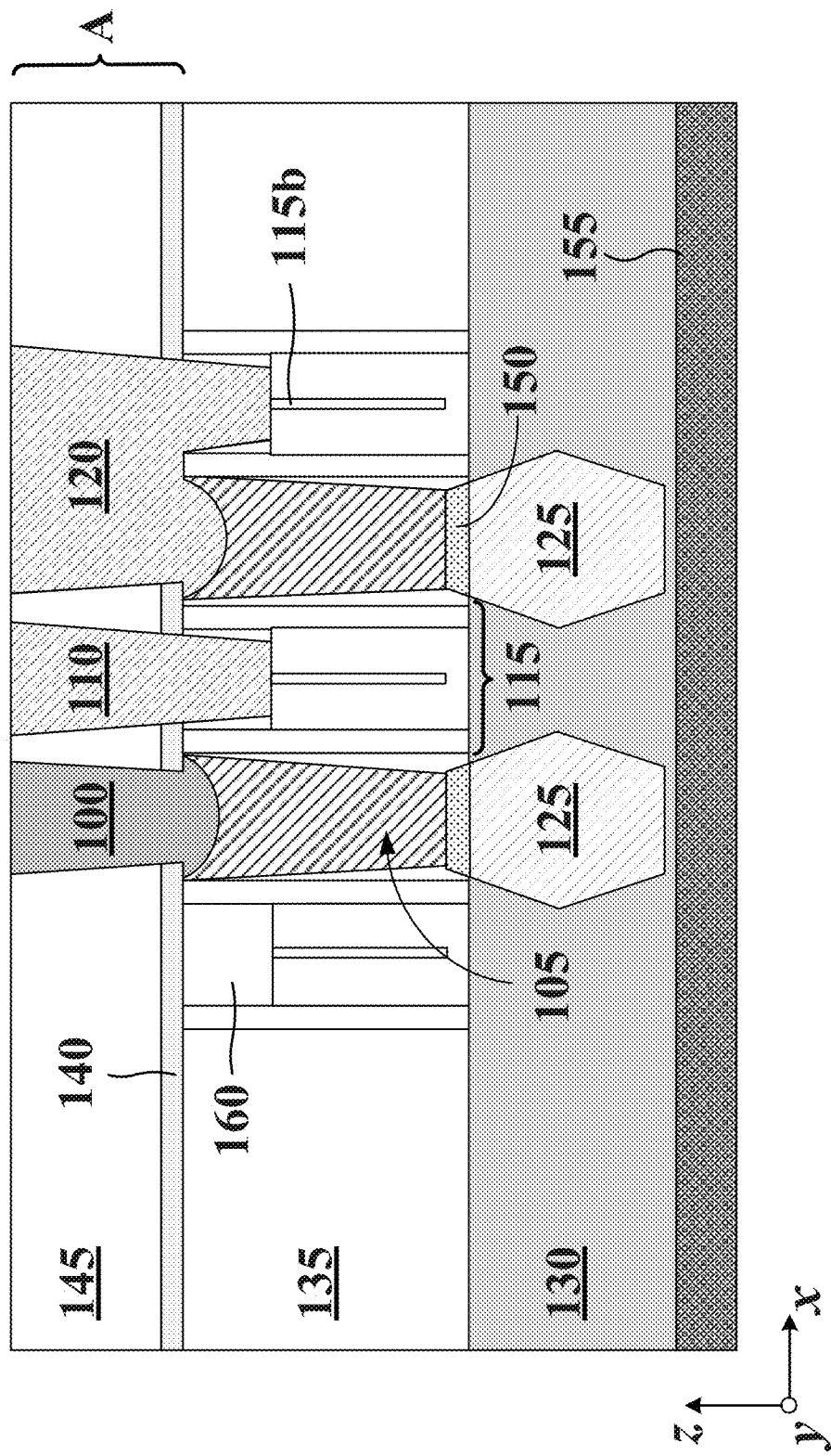

In referring to FIG. 2B, method 200 continues with operation 240 and the process of polishing W metal 1100 to form the W conductive structures, such as W gate conductive structure 110 and W conductive structure 120. In some embodiments, the polishing process of operation 240 includes a CMP process that removes top portions of the W conductive structures and third dielectric 700. In some embodiments, the polishing process of operation 240 terminates when the top surface of Ru conductive structure 100 is exposed as shown in FIG. 12. In some embodiments, the polishing process of operation 240 is selective towards third dielectric 700 and the W metal. Consequently, Ru conductive structure 100 is not substantially polished. In some embodiments, the thickness of second dielectric 145 after the polishing process of operation 240 is substantially equal to the thickness of dielectric 145 after the polishing process of operation 220.

In referring to FIG. 2B, method 200 continues with operation 245 and the process of forming an upper metallization layer on the Ru and W conductive structures, like upper metallization layer B shown in FIGS. 1A-C. By way of example and not limitation, the metallization layer can be a BEOL metallization layer with Cu conductive structures (e.g., lines and vias) formed on the Ru and W conductive structures. In referring to FIGS. 1A-C, the metallization layer can be formed by, for example, depositing and patterning low-k dielectric material 175 on second dielectric 145 to form via or line openings that expose the underlying Ru and/or W conductive structures according to a design layout. Further, selectively forming a TaN barrier layer 170a on low-k dielectric material 175, the exposed surfaces of the W conductive structures, and second dielectric 145 prior to depositing Cu metal fill 170b as shown in FIGS. 1A-C. By way of example and not limitation, selective deposition of TaN barrier layer 170a on low-k dielectric material 175, the exposed surfaces of the W conductive structures and second dielectric 145 can be achieved with the use of a self-aligned-monolayer (SAM). For example, a quaternary ammonium salt can be deposited to prevent the formation of TaN on exposed surfaces of Ru conductive structure 100.

Figure 13:
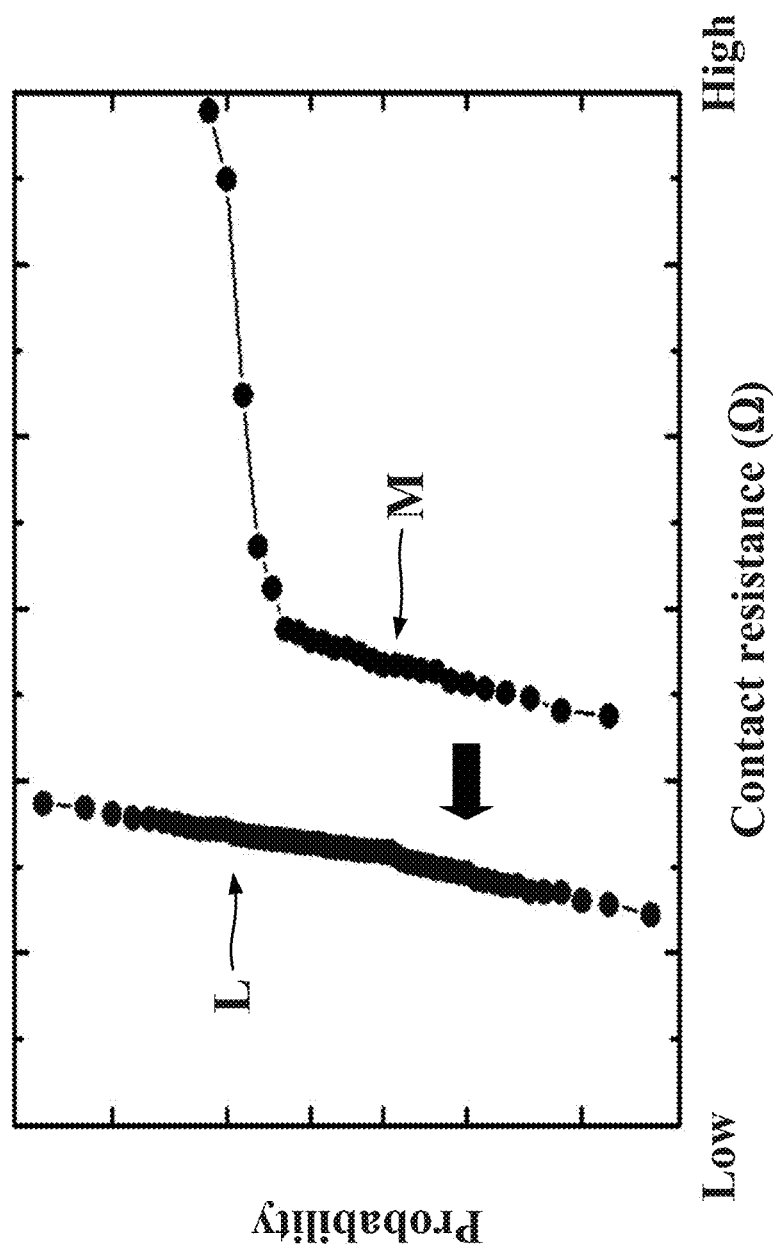
FIG. 13 is a probability plot that compares contact resistances of a ruthenium contact and a tungsten contact.

As discussed above, Cu metal fill 170b can be formed directly on Ru conductive structure 100 without a TaN barrier layer 170a. This is possible because Ru metal can function as a barrier material for Cu diffusion. In some embodiments, the contact resistance reduction achieved with the use of Ru conductive structure 100, as compared to a W conductive structure, on Co conductive structure 105 is about 44%. For example, FIG. 13 is a probability plot that compares the contact resistance of a Ru contact represented by a curve L and the contact resistance of a W contact represented by a curve M. As shown in FIG. 13, the contact resistance for the Ru contact (curve L) has a lower resistance and a tighter distribution (e.g. less variation) than that of the W contact (curve M). Further, Ru conductive structures, like Ru conductive structure 100, formed on Co conductive structures 105 are substantially free from a resistive phase transition and defects such as corrosion, material segregation, and/or material loss.

In some embodiments, operations 205-220 and 225-240 can be performed in a different order from that described above in operation 200. For example, the Ru conductive structures, like Ru conductive structure 100 described by operations 205-220, can be formed after the formation of the W conductive structures, like W conductive structures 110 and 120 described by operation 225-240.

In some embodiments, Ti can be detected by analytical methods, such as energy-dispersive X-ray spectroscopy (EDS), at an interface between W conductive structure(s) 110 and the layers of gate structure 115 (e.g., stack 115a and metal fill 115b). In some embodiments, the interface between W conductive structure(s) 110 and the layers of gate structure 110 in which the Ti signal is detected has a thickness between about 0.9 nm and about 2.9 nm. According to some embodiments, the presence of Ti at the interface between W conductive structure(s) 110 and the layers of gate structure 115 is attributed to the fabrication process of silicide layer 150 prior to the formation of Co conductive structures 105.

Various embodiments described herein are directed to methods for the fabrication of Ru conductive structures with an aspect ratio between about 3:1 and about 4:1 to replace W conductive structures formed on Co conductive structures. According to some embodiments, Ru conductive structures offer reduced contact resistance and improved thermal stability compared to W conductive structures. In some embodiments, metallization layers with a combination of W conductive structures and Ru conductive structures can be formed. In some embodiments, the Ru conductive structures are formed prior to the formation of the W conductive structures. In some embodiments, the Ru conductive structures are formed after to the formation of the W conductive structures. In some embodiments, Ru conductive structures are formed on Co conductive structures and W conductive structures are formed on gate structures. In some embodiments, the Ru metal is grown selectively on underlying Co conductive structures without the presence of intervening layers (e.g., without the presence of barrier layers or liner layers). In some embodiments, Cu conductive structures disposed on Ru conductive structures are formed without the presence a diffusion barrier layers between the Cu metal in the Cu conductive structures and the Ru metal in the Ru conductive structures. In some embodiments, Ru conductive structures exhibit about 44% lower electrical resistance compared to W conductive structures.

In some embodiments, a structure includes a first gate structure formed on a substrate, a second gate structure formed on the substrate, an epitaxial structure between the first and second gate structures, and a first conductive structure having a first metal and disposed on the epitaxial structure. Further, the structure includes a second conductive structure having a second metal and disposed on the first conductive structure. The structure also includes a third conductive structure having a third metal and disposed on the second gate structure, where the first, second, and third metals are different from one another.

In some embodiments, a structure includes a substrate, first and second cobalt S/D contacts formed over the substrate, first and second gate structures formed over the substrate 155, and a first metallization layer formed over the first and second S/D contacts and over the first and second gate structures 115. The first metallization layer includes a ruthenium contact on the first cobalt S/D contact, a first tungsten contact 110 on the first gate structure, and a second tungsten contact on the second gate structure and the second cobalt S/D contact. The structure further includes a second metallization layer on the first metallization layer. The second metallization layer includes a conductive structure filled with copper and a barrier layer, which surrounds the copper. In the second metallization layer, the copper is in contact with the ruthenium contact, and the barrier layer is interposed between the copper and the first tungsten contact 110 and between the copper and second tungsten contact.

In some embodiments, a method includes depositing a dielectric layer over a first cobalt contact, a second cobalt contact, and a gate structure; forming a first opening in the dielectric layer to expose the first cobalt contact; and filling the first opening with ruthenium metal to form a ruthenium contact on the first cobalt contact. The method also includes forming a second opening in the dielectric layer to expose the second cobalt contact and the gate structure; filling the second opening with tungsten to form a tungsten contact on the second cobalt contact and the gate structure. Further, the method includes forming a copper conductive structure on the ruthenium contact and the tungsten contact, where the copper from the copper conductive structure is in contact with the ruthenium metal from the ruthenium contact.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
   depositing a dielectric layer on a first cobalt contact, a second cobalt contact, and a gate structure;
   forming a first opening in the dielectric layer to expose the first cobalt contact;
   filling the first opening with a ruthenium layer to form a ruthenium contact on the first cobalt contact;
   forming a second opening in the dielectric layer to expose the second cobalt contact and the gate structure;
   filling the second opening with a tungsten layer to form a tungsten contact on the second cobalt contact and the gate structure; and
   forming a conductive structure on the ruthenium contact and the tungsten contact.

2. The method of claim 1, wherein forming the first opening comprises etching a top portion of the first cobalt contact with a wet etching chemistry to form an arcuate shaped etched portion in the first cobalt contact.

3. The method of claim 1, wherein forming the second opening comprises etching a top portion of the second cobalt contact with a wet etching chemistry to form an arcuate shaped etched portion in the second cobalt contact.

4. The method of claim 1, further comprising:
   depositing a stack of titanium layer and titanium nitride layer on the ruthenium layer; and
   polishing the stack, the ruthenium layer, and the dielectric layer to form the ruthenium contact.

5. The method of claim 1, further comprising:
   depositing a stack of titanium layer and titanium nitride layer on the tungsten layer; and polishing the stack and the tungsten layer to form the tungsten contact.

6. The method of claim 1, wherein forming the conductive structure comprises:
depositing a nitride layer directly on the tungsten contact; and
depositing a copper layer on the ruthenium contact through an opening in the nitride layer.

7. The method of claim 1, wherein forming the second opening in the dielectric layer comprises:
etching a first portion of the dielectric layer on the gate structure in a first etch process; and
etching a second portion of the dielectric layer on the second cobalt contact in a second etch process.

8. The method of claim 1, further comprising doping the dielectric layer with germanium atoms after filling the second opening with the tungsten layer.

9. The method of claim 1, further comprising doping the dielectric layer with a germanium dopant dose between about $1\times10^{15}$ atoms/cm$^2$ and about $1.8\times10^{15}$ atoms/cm$^2$.

10. The method of claim 1, further comprising depositing an other dielectric layer on the ruthenium contact prior to forming the second opening.

11. A method, comprising:
depositing a dielectric layer on a first cobalt contact, a second cobalt contact, and a gate structure;
forming a first opening in the dielectric layer to expose the first cobalt contact;
forming a ruthenium contact in the first opening;
forming a second opening in the dielectric layer to expose the second cobalt contact and the gate structure; and
forming a tungsten contact in the second opening.

12. The method of claim 11, wherein forming the ruthenium contact comprises:
depositing a ruthenium layer in the first opening;
depositing a titanium layer on the ruthenium layer;
depositing a titanium nitride layer on the titanium layer; and
polishing the ruthenium layer, the dielectric layer, the titanium layer, and the titanium nitride layer.

13. The method of claim 11, wherein forming the tungsten contact comprises:
depositing a tungsten layer in the first opening;
depositing a titanium layer on the tungsten layer;
depositing a titanium nitride layer on the titanium layer; and
polishing the tungsten layer, the titanium layer, and the titanium nitride layer to planarize a top surface of the tungsten layer with a top surface of the ruthenium contact.

14. The method of claim 11, further comprising depositing an other dielectric layer on the ruthenium contact prior to forming the second opening.

15. The method of claim 11, wherein forming the second opening comprises:
forming a first portion of the second opening on the gate structure in a first etch process; and
forming a second portion of the second opening on the second cobalt contact in a second etch process.

16. The method of claim 11, further comprising doping the dielectric layer with germanium atoms after forming the tungsten contact.

17. A method, comprising:
forming a fin structure disposed on a substrate;
forming first and second source/drain (S/D) structures on the fin structure;
forming first and second conductive structures comprising a first metal on the first and second S/D structures, respectively;
forming a third conductive structure comprising a second metal on the first conductive structure, wherein the second metal is different from the first metal;
forming a gate structure on the fin structure; and
forming a fourth conductive structure comprising a third metal on the gate structure and the second conductive structure, wherein the third metal is different from the first and second metals.

18. The method of claim 17, wherein forming the first and second conductive structures comprises forming first and second cobalt structures.

19. The method of claim 17, wherein forming the third conductive structure comprises forming a cobalt structure.

20. The method of claim 17, wherein forming the fourth conductive structure comprises forming a tungsten structure.

* * * * *